United States Patent [19]

Scheuneman et al.

[11] Patent Number: 5,060,145
[45] Date of Patent: Oct. 22, 1991

[54] MEMORY ACCESS SYSTEM FOR PIPELINED DATA PATHS TO AND FROM STORAGE

[75] Inventors: James H. Scheuneman, St. Paul; Larry L. Byers, Apple Valley; Wayne A. Michaelson, Circle Pines, all of Minn.

[73] Assignee: Unisys Corporation, Blue Bell, Pa.

[21] Appl. No.: 403,624

[22] Filed: Sep. 6, 1989

[51] Int. Cl.$^5$ ............................ G11C 7/00; G06F 7/00; G06F 13/00
[52] U.S. Cl. ................................ 364/200; 365/189.04; 365/230.03; 365/230.05
[58] Field of Search ...................... 365/189.01, 189.04, 365/189.08, 230.03, 230.05

[56] References Cited

U.S. PATENT DOCUMENTS

| | | | |
|---|---|---|---|
| 3,573,854 | 4/1971 | Watson et al. | 364/200 |
| 4,731,724 | 3/1988 | Michel et al. | 364/200 |
| 4,845,677 | 7/1989 | Chappell et al. | 365/230.03 X |
| 4,853,896 | 8/1989 | Yamaguchi | 365/230.03 X |
| 4,891,795 | 1/1990 | Pinkham et al. | 365/230.03 |

*Primary Examiner*—Alyssa H. Bowler
*Attorney, Agent, or Firm*—John B. Sowell; Glenn W. bowen; Mark T. Starr

[57] ABSTRACT

A novel memory access system is provided for simultaneously processing request for access to a plurality of memory banks. A plurality of input-output ports are coupled to a read bus and to a write bus which are in turn coupled to the memory banks to be accessed by read and write commands initiated by processors coupled to the I/O ports. Pipeline control means receive the request for access functions from the processors and are operable to resolve conflict between plural request. The pipeline control means sequentially raise either write or read request on control and address buses and generate time slot windows during which subsequent write or read data transfer operations will occur so that data being pipelined on the write and read buses is being simultaneously accessed.

17 Claims, 7 Drawing Sheets

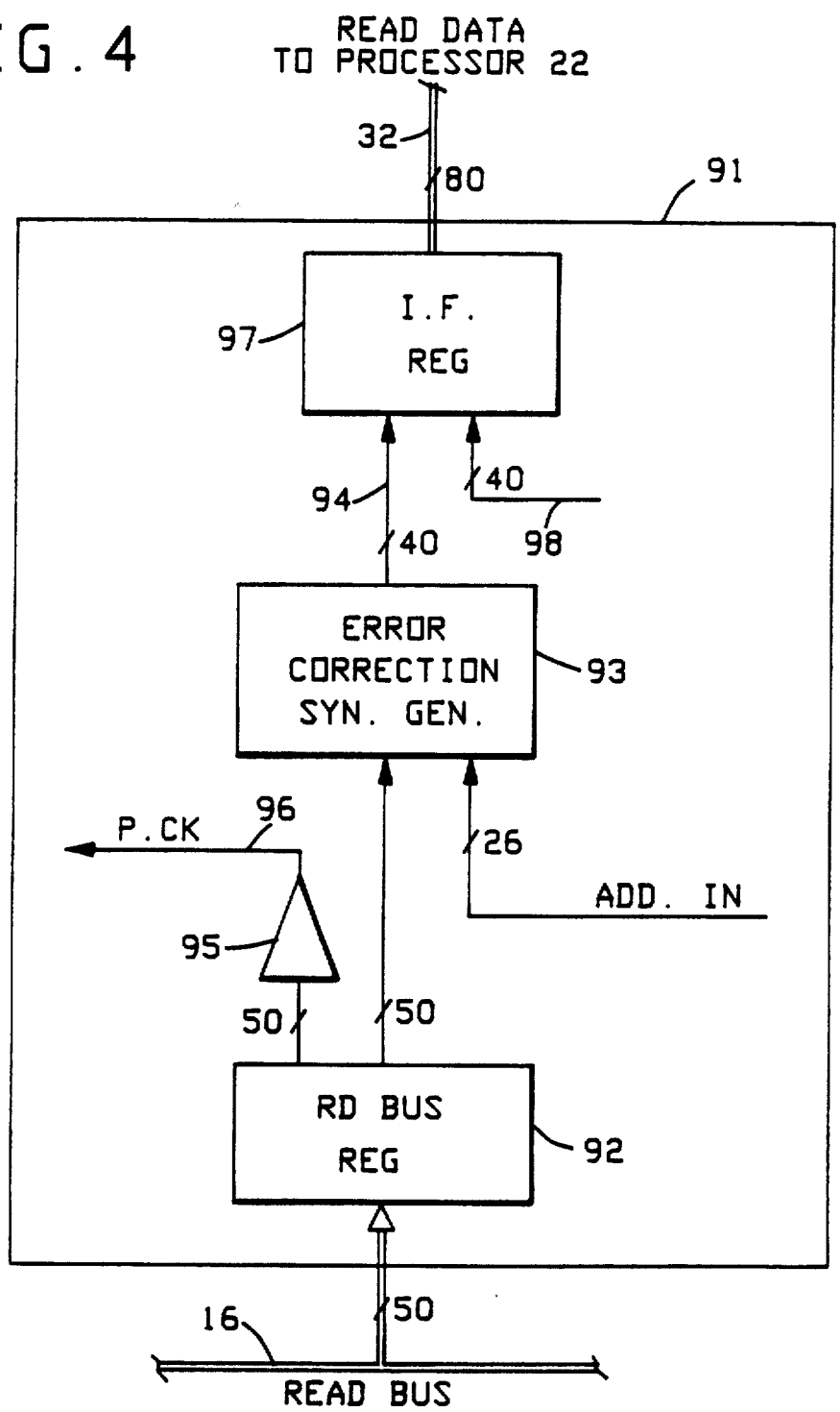

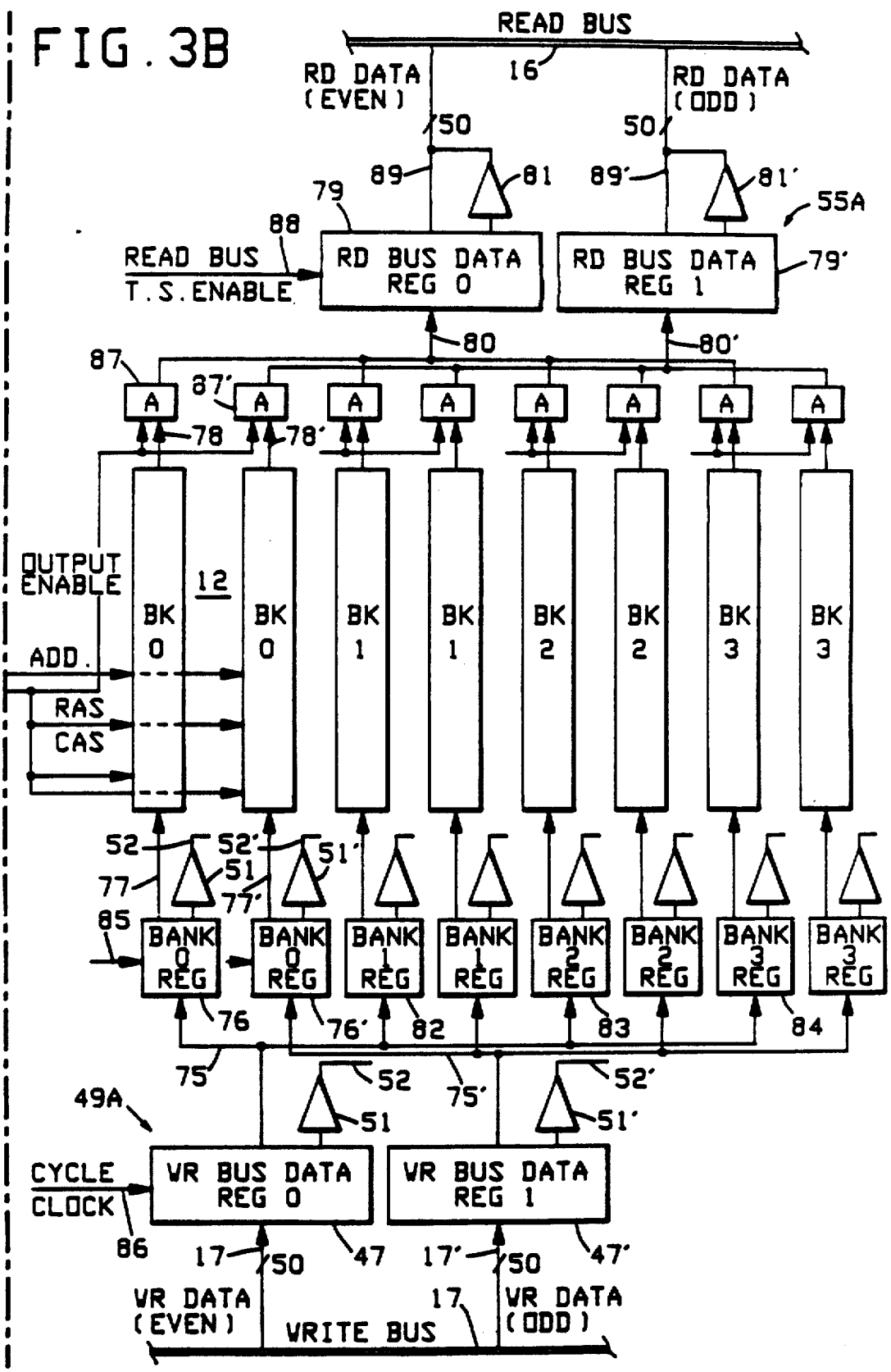

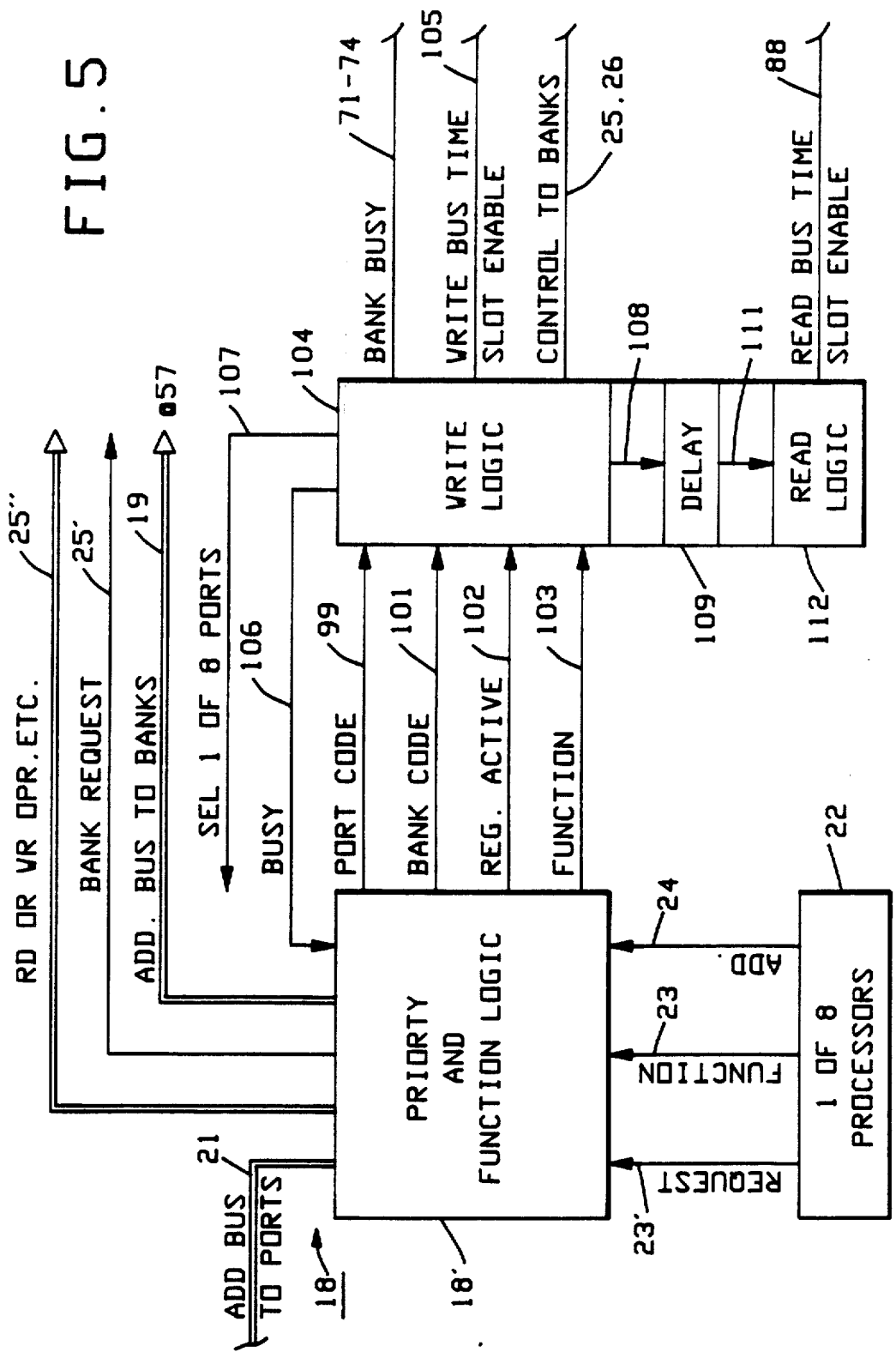

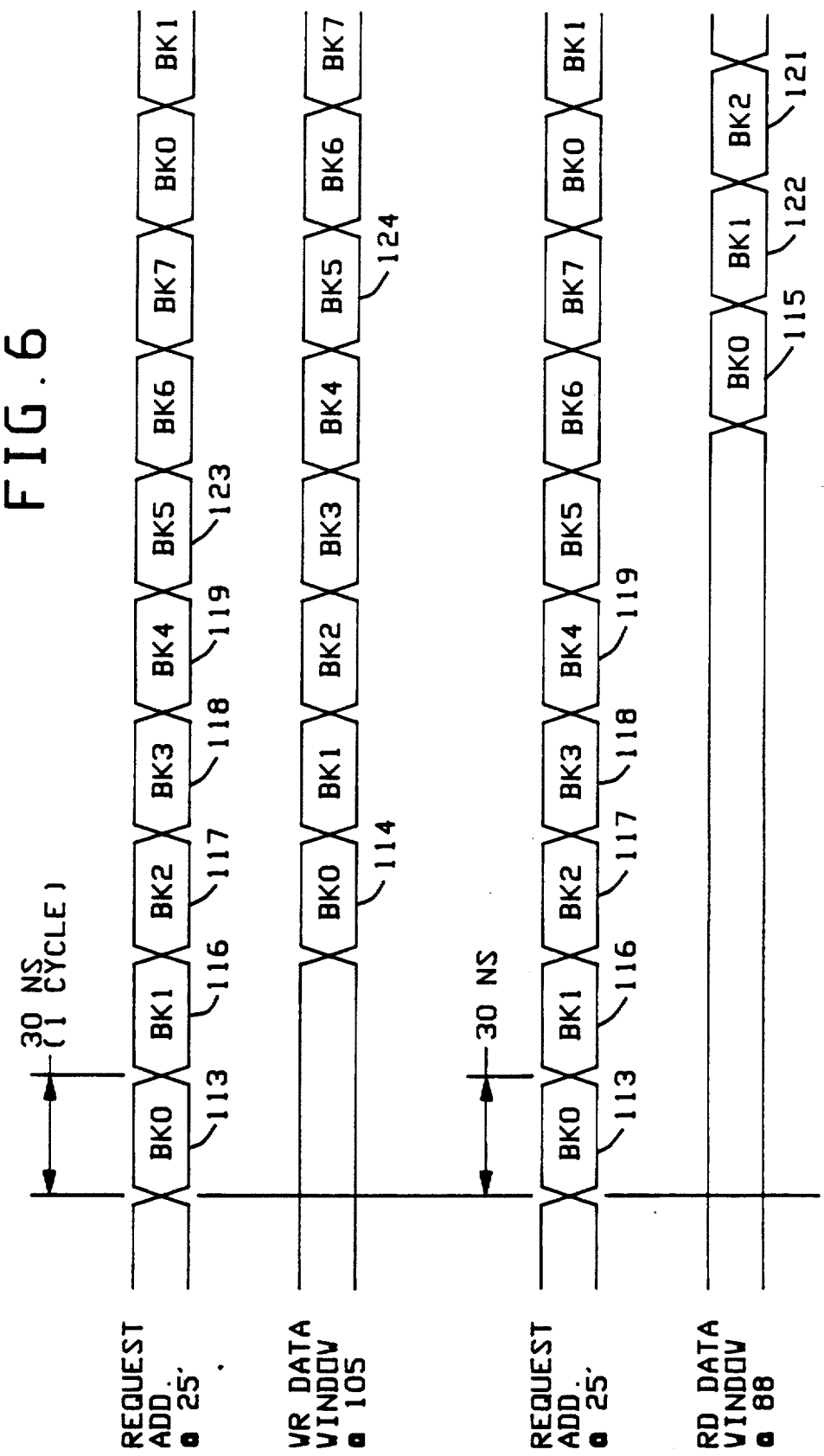

MEMORY ACCESS SYSTEM FOR PIPELINED DATA PATHS TO AND FROM STORAGE

BACKGROUND OF THE INVENTION

1. Field of the Invention

The present invention relates to a novel system for accessing a main memory of a large mainframe computer. More particularly, the present invention relates to an access system that simultaneously processes requests for access to a plurality of memory banks and resolves conflicts between the read and write bus by assigning access time slots to the individual banks during the time when data will be transferred to or from a specific memory bank.

2. Description of the Prior Art

Heretofore, large mainframe processing systems have employed separate read and write paths. Information from a specific port is multiplexed to a requested memory bank of a plurality of banks so as to create a particular and unique path between an I/O port and a specified bank in memory. Similarly, information being accessed from a memory bank has a multiplexed path for each requestor for a read operation from each memory bank so as to create a unique path from a bank in memory to an input/output requestor port. It will be understood that such individual paths permits information to be processed in parallel and that individual paths may be set up in parallel so as to transfer information from different ports to different banks in memory. This system of accessing memory is sometimes referred to as direct I/O muxing of memory banks.

Such systems permits parallel data paths and parallel processing of simultaneous requests. It has been suggested that the complex direct I/O muxing circuitry can be simplified by providing a plurality of read buses, one for each I/O port. This would permit simultaneous processing of requests from different banks of memory but would prevent processing of simultaneous requests from the same bank in memory.

It would be desirable to further simplify the operation of direct I/O muxing by eliminating the complex muxing circuitry and by providing a single read bus and a single write bus for all of the memory banks at a main storage unit and also providing an access system which permits simultaneous overlapping process of requests and unique data transfer times on the read and write bus.

SUMMARY OF THE INVENTION

It is a principle object of the present invention to provide a novel memory access system for pipelined data paths to and from a main storage unit.

It is another principal object of the present invention to provide a novel access system which generates time slot windows in response to individual requests to different banks in memory.

It is another principal object of the present invention to provide a novel memory access system which employs a separate read bus and a separate write bus so that read and write requests may be operated in parallel.

It is a general object of the present invention to provide a simplified pipeline control and priority resolution logic circuitry in conjunction with input address and control logic circuitry to specify memory addresses at one of a plurality of memory banks.

It is another general object of the present invention to provide simplified write data path logic circuitry and simplified read data path logic circuitry for an improved memory access system.

According to these and other objects of the present invention, there is provided a main storage unit comprising a plurality of memory banks connected through logic circuitry to a separate read bus and a separate write bus and to a plurality of I/O ports. Pipeline control means are provided for generating unique data transfer time windows for each of the banks of memory so that data is transferred during a unique transfer time for each of the banks of memory so as to avoid conflicts on the read and write bus.

BRIEF DESCRIPTION OF THE DRAWINGS

FIGS. 3(a) and 3(b) are block diagrams of the input address and control logic circuitry employed to generate a control function and specify a memory address at one of the memory banks on a memory card;

FIG. 4 is a block diagram showing a read data path from a memory card to a processor;

FIG. 5 is a simplified schematic block diagram of the pipeline control showing generation of time slot signals and control signals, and FIG. 6 is a waveform diagram of the read and write time slots generated by the pipeline controls of FIG. 5 for controlling access to the memory banks.

DESCRIPTION OF THE PREFERRED EMBODIMENT

Figure 1:
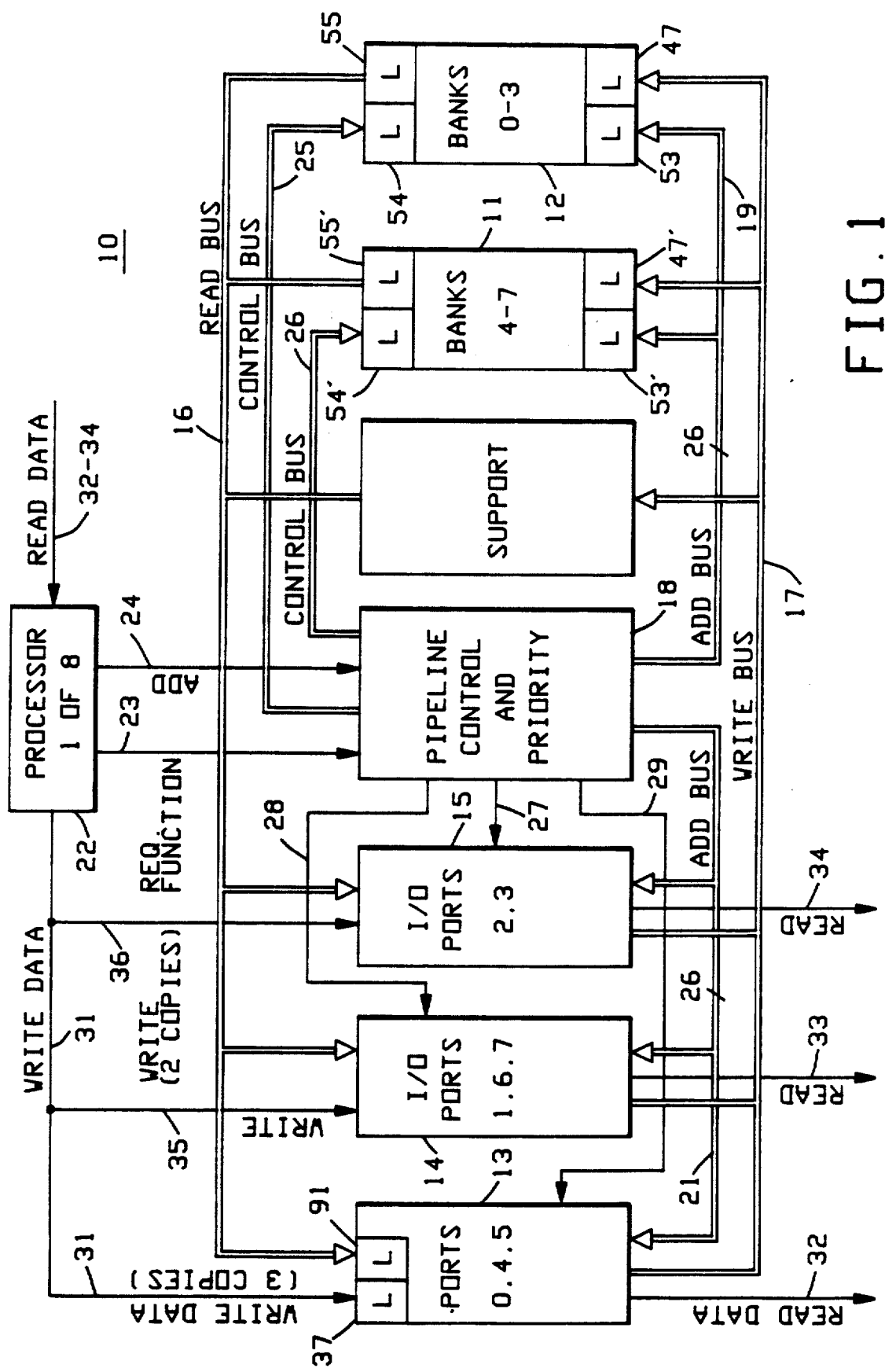
FIG. 1 is a block diagram showing a plurality of input-output port cards and a plurality of memory cards interconnected by a read bus and a separate write bus and having a pipeline control for pipelining data on the buses.

Refer now to FIG. 1 showing a block diagram of the preferred embodiment memory access system 10 comprising a plurality of memory bank cards 11, 12 and a plurality of I/O port cards 13-15 interconnected by a read bus 16 and a write bus 17. Pipeline control means 18 are provided with an address bus 19 which connect to the banks of memory 11, 12 and an address bus 21 connected to the I/O ports 13 to 15.

In the preferred embodiment of the present invention, one of eight processors 22 raise a request and function operation on line 23 to the pipeline control means 18 and supplies an address on address line 24 to the pipeline control means 18. The pipeline control means 18 processes this information and supplies control signals on control buses 25 and 26 to memory banks 12 and 11 and also supplies memory address information on address bus 19 to the same memory banks. The address information on bus 21 is used by the port card logic for generating check bits. Control lines 27 to 29 are employed to select the I/O port designated by the processor 22 for the transfer of information as will be explained hereinafter.

Write data appearing on line 31 from one of the processors 22 is applied at the input of a predetermined port 13, 14 or 15. In the preferred practice, the processors are associated with predetermined ports so that the processor designates its predetermined port for processing the write data on a write data line 31. Write data on line 31 is processed in one of the I/O ports 13 and appears on write bus 17 as an input to the banks of memory 11, 12, one of which is specified by the address on address bus 19. The pipeline control 18 raises the initiate signal on a line in control bus 25 or 26 through the corresponding bank addressed on address bus 19. During the predetermined time slot for the transfer of write data, the data on write bus 17 is written into the addressed memory location in one of the banks of memory, thus completing a write data operation.

In a similar matter, data already written into a memory location specified by an address on address bus 19 is made available at a predetermined time slot window time on read bus 16 for an input to one of the I/O ports on port cards 13 to 15 and the data read from the address in a memory bank appears on one of the read data lines 32 to 34 from one of the I/O ports and is applied as an input via a read data line to the processor 22. It will be understood that a unique read data line 32 to 34 is provided for each of the I/O ports and that a unique write data line 31, 35 and 36 from the processor 22 is provided for each of the I/O ports. These lines are activated for the read data and write data operations as will be explained hereinafter.

Figure 2:
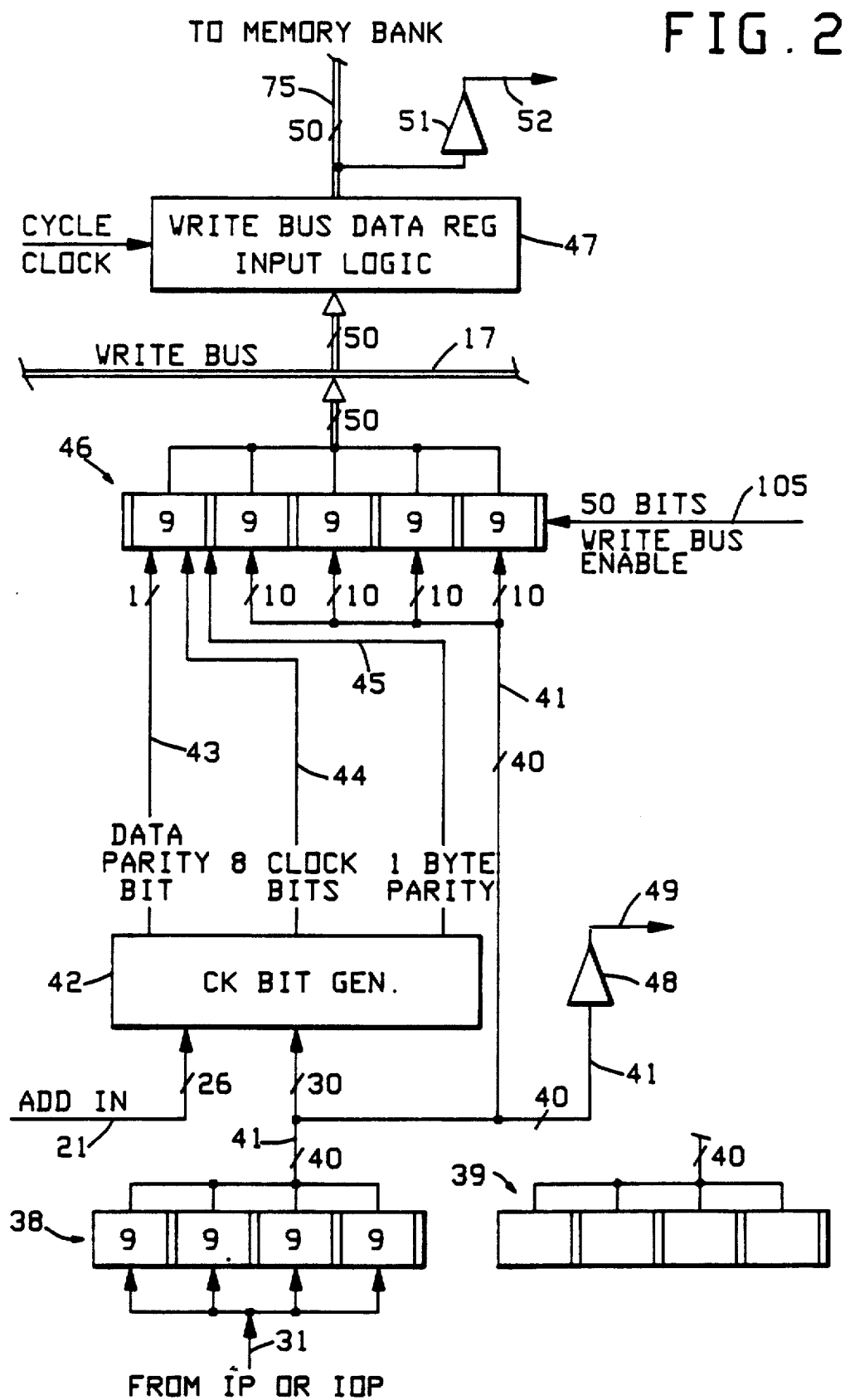
FIG. 2 is a block diagram of a write data path from a processor to the input of the memory cards containing plural memory banks.

Refer now to FIG. 2 showing a block diagram of a write data path from one of the processors 22 to the input of the memory cards. The write data on line 31 of FIG. 1 is shown being applied to a logic block 37 shown in greater detail in FIG. 2. Logic circuitry 37 comprises an input register 38 for an even word and an input register 39 for an odd word. The logic 37 for the even word is shown connected to register 38. It will be understood that the logic for the odd word 39 is identical. The even word comprises four bytes of nine bits each having a parity bit thus producing an even word output of 40 bits on line 41. Line 41 is applied to the input of check bit generator 42 along with the input address on bus 21 comprising 26 bits. The 36 data bits on line 41 and the 26 address bits on bus 21 produce a data parity bit on line 43, eight check bits on line 44 and a byte parity bit on line 45 which are used to produce the first byte in write bus register 46. The remaining four ten bit bytes in the 50 bit write bus register 46 are produced by the 40 bits on line 41. Each byte comprises nine data bits and one parity bit. The 50 bit output from register 46 is applied to the write bus 17, thus, is available to the inputs of the memory banks 11 and 12 at the write bus data register input logic 47, also shown in FIG. 1. The even word input data on line 41 is also applied to a write data parity check circuit 48 to produce an error signal on line 49 in the event of a negative parity check. Similarly, the 50 bits in register 47, which are applied to the memory banks, are also applied to a write data bus parity check device 51 to produce an error signal on line 52 in the event of a negative parity check.

Figure 3A:
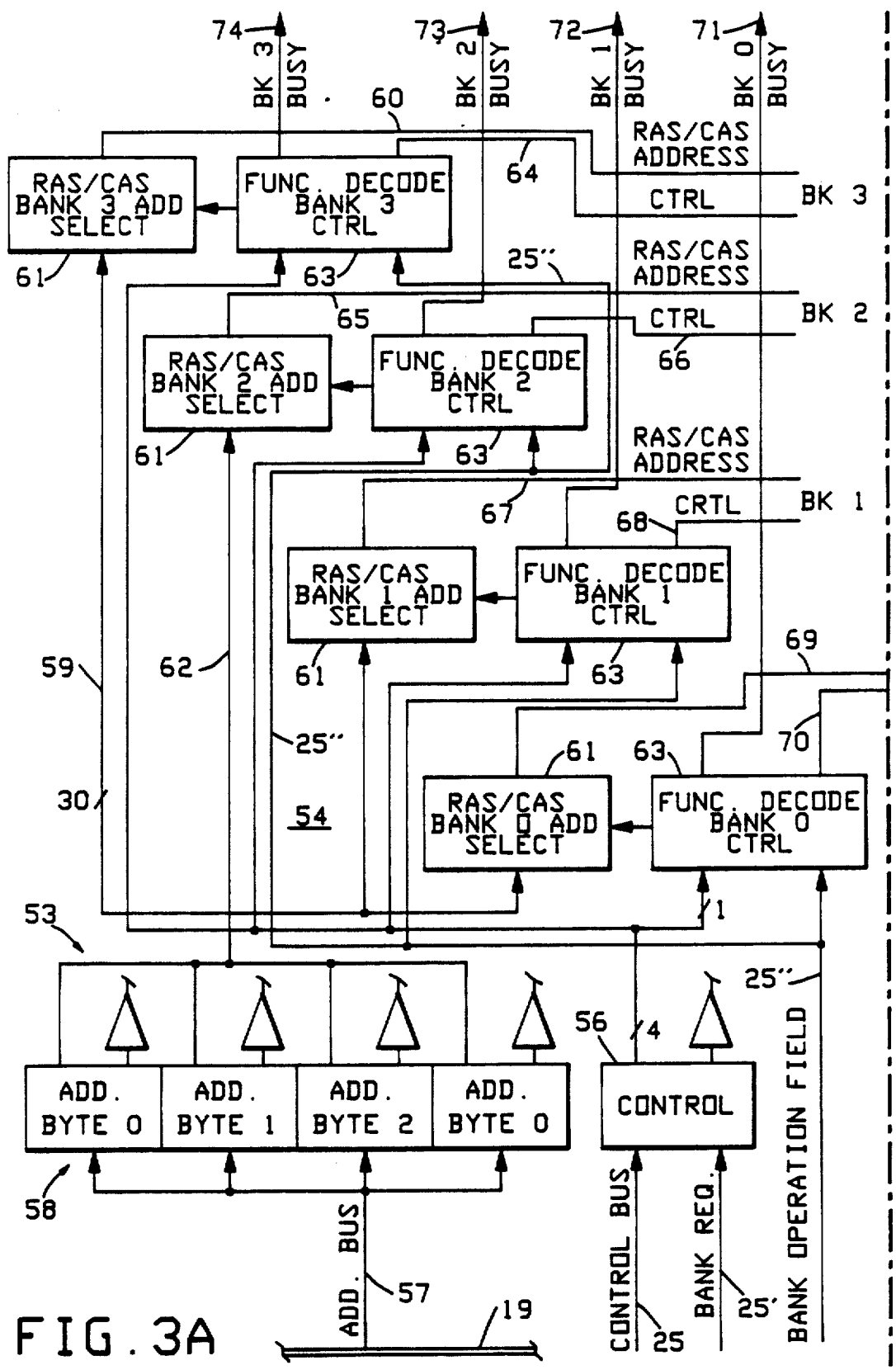

Refer now to FIG. 3 showing a block diagram of the control and data paths associated with one of the storage cards 11, 12 shown in FIG. 1. The address generated on bus 19 is applied to the address bus input logic 53 shown comprising a four byte register 58. Control register 56 is shown having a control bus input 25 and a bank request input 25'. A bank operation field input 25" is connected to the control bus input logic 54 which comprises the control register 56.

The write data bus 17 comprises input lines 17, 17' shown applied to the write bus input logic 47A having a pair of write bus data registers 47, 47' and parity check circuits 51, 51'. Further, read bus output 55A comprises register 79, 79' shown connected to the memory bank card 12 comprising a plurality of memory banks BK0 to BK3. The output of the read bus output logic 55A is shown applied to the read bus 16.

A 30 bit address on line 57 is applied to the register 58 of address logic 53 to produce a 30 bit address field on line 59 that is applied to the address select register 61 employed to specify the row and column address of the memory location in each of the banks 0 thru 3. The output of control register 56 on line 62 is applied to the function decode and bank control register 63 to produce bank 3 control signals on line 64 which provides the timing control signals for the DRAM memory in bank 3 of memory bank 12. The signals on lines 60 and 64 provide the information for accessing a specific address in memory for reading or writing during a predetermined specified time period. In similar manner, the output signals on lines 65, 66 at bank 2 and 67, 68 at bank 1 and 69, 70 at bank 0 also supply the necessary address information and control information for specifying a memory location in these respective banks.

The aforementioned function decode and bank control logic are shown producing on line 71 to 74 the bank zero to bank 3 busy signals that will be used by the pipeline control means to be explained in more detail hereinafter.

The bank control signals on lines 69 and 70 are shown being applied to bank zero memory bank, and it will be understood that the same signals for banks 1, 2, 3 are applied to the other banks in a similar manner. The write data on bus 17 is shown applied to the write bus input logic 47 to produce a 50 bit write data word on line 75 that is applied to the even word bank zero register 76. The output of the bank zero register 76 on line 77 comprises a write data word which is applied to the even side of bank zero memory. Similarly, the write data word on line 17 is applied to a bus data register 47' in logic 47 and produces an output on line 75 which is applied to the odd word bank zero register 76. The output from register 76 on line 77 is applied to the odd word side of bank zero memory. The double word stored in bank zero comprises two 45 bit words at the output 78, 78' because the 50 bit input to the register 76 and 76' have been parity checked by write data parity check circuits 51 and 51', thus, the parity bits need not be stored in bank zero storage.

When reading the data stored in bank zero, the two 45 bit words appear on output lines 78 and 78 and are respectively applied to the inputs of the read bus data register 79 and 79' which comprise a part of read bus output logic 55A. Read bus output logic 55A further comprises a pair of parity bit generators 81 and 81' which generate five parity bits that are added to the 45 data bits to produce 50 bit read data words on bus 16 as shown.

It will be understood that the write data word on buses 17, 17' produces an output word on line 75, 75' which is applied to all of the bank zero to bank 3 via the respective bank 1 to bank 3 registers 82 to 84 as explained hereinbefore. However, it will be understood that a control line from function decode and bank control logic 63 is applied to bank zero registers 76 and 76' via line 85 and not to the other bank register 82 thru 84, thus, the information which was on bus 17 would only appear at the input lines 77, 77' of bank zero and not to the input lines to banks 1 thru 3.

In summary, the write data from the port card which was shown in FIG. 2 in register 46 was applied to the write bus 17 and stored in the write bus data register 47, 47'. The information in register 47A is made available to all eight registers 76, 76' and 82 to 84, but only two of the eight registers is enabled by the input enable bank signal on line 85 from the associated control logic 63. A cycle clock on line 86 is applied to the registers 47 every 30 nanoseconds in the present invention. The input enable signal on line 85 is a 30 nanoseconds enable pulse and does not occur every clock cycle time, but is unique to each of the individual banks, thus, on FIG. 3 there would only be four unique enable bank signals. Since FIG. 3 only shows bank zero to 3 and FIG. 1 shows banks zero thru 7, it will be understood that there are eight unique input enable bank signals. The output enable signal on line 70 is applied to AND gate 87 to gate the output data on line 78 to the bank output data line 80. The data on lines 80, 80' is clocked into the register 79, 79'. The data stored in the read bus data register 79 is read out by the enable signal on read bus time slot enable line 88. The data on lines 89, 89' to read bus 16 is read out during the unique enable time for each of the eight memory banks zero thru 7. As will be explained hereinafter, the read bus enable time and the write bus enable time for each of the banks provides a 30 nanosecond window during which information may be read into or read out of one of the memory banks.

Refer now to FIG. 4 showing a block diagram of a read data path from a memory card 12 to the processor 22. The aforementioned data on read bus 16 is shown being applied to the read bus input logic 91 shown in FIG. 1. Read bus input logic 91 comprises a read bus register 92 which stores an odd or even data word comprising 5 bytes of 50 bits. The 50 bits of the data word are applied to syndrome generator and error correction circuit 93 to produce the original 40 bits of data which includes the four parity bits on line 94. Also, the 50 bits of data are applied to parity checking circuit 95 to produce a parity check signal on line 96 in the event of a negative parity check. The 40 bits of data on line 94 are applied to interface register 97 along with a similar 40 bits on line 98 from an odd read bus register (not shown) like register 92. Interface register 97 produces an odd and even word output of 80 bits on read data line 32 to processor 22 as shown and described in FIG. 1.

Refer now to FIG. 5 showing a simplified schematic block diagram of the pipeline control 18 shown generating control signals. Pipeline control means 18 comprises a priority function logic block 18' which has a request input 23', a function input 23 and an address input 24 from one of the eight processors 22 (also shown in FIG. 1). This information is applied to the function logic 18 to produce the address to the I/O ports on address bus 21 and the address to the memory banks on address bus 19. The address comprises 26 address bits. The six bit function information on line 23 is processed in block 18 and produces a read or write function operation signal from its bank operation field on line 25" (also shown in FIG. 3). Similarly, the one bit request signal on line 23 to logic block 18 produces a bank request signal on line 25' (also shown on FIG. 3).

Function logic 18' also produces a three bit port code signal on line 99 and a 3 bit bank code signal on line 101. Similarly, a request active signal is produced on line 102 and a four bit encoded function code signal on line 103. The four outputs from logic 18' are applied to write logic block 104 which produces the write bus time slot enable signal on line 105 (also shown on FIG. 2) as an input to register 46. Further, the control signals to the banks of memory on buses 25 and 26 are shown as an output from logic 104. The bank busy signals for the four banks shown in FIGS. 3 at line 71 to 74 are shown as an input to write logic 104. These signals produce the bank busy signals on line 106 to the function logic 18' and further produce a selection signal on line 107 which selects one of the eight ports employing the aforementioned control lines 27 to 29 from control logic 18 shown in FIG. 1. The information in write logic 104 which is usable for read logic is applied via line 108, delay 109 and line 111 to the read logic register 112. Read logic 112 produces the aforementioned read bus time slot enable signal on line 88 which was employed in FIG. 3 to enable read bus data register 79. The write bus time slot enable signal on line 105 and the read bus time slot enable signal on line 88 occur at different cycle times for each of the banks of memory to be described in more detail hereinafter.

A feature of the present invention is that the processors 22 shown in FIG. 1 are attempting to raise a request in one of the memory banks during each of the 30 nanosecond cycle times. More than one request for access to a memory bank may be raised simultaneously to the pipeline control and priority logic 18 which resolves the priorities between the simultaneous request for the same memory block and further resolves all conflicts for access time to a read bus or a write bus. It will be understood that information may be applied to read bus 16 at the same time information is being written into a memory bank from write bus 17, provided that different memory banks are being accessed. Further, no two memory banks may be accessed so as to generate data on read bus 16 during the same unique time slot window or cycle. Similarly, the corollary is true in that the data words on write 17 can only be written into one of the memory banks during a unique time slot window or cycle.

Refer now to FIG. 6 showing a waveform diagram for the read and write time slots generated by the pipeline control logic 18 for controlling access to the memory banks zero to 7 shown in cards 11 and 12 of FIG. 1. The address on line 24 to function logic 18' in FIG. 5 is shown producing a bank request signal on line 25' which is also shown as an input to control logic 56 on FIG. 3. This signal is immediately processed and employed to generate a request signal for the specified bank shown as a 30 nanosecond duration bank request signal 113. The bank request signal 113 is employed to generate the write data enable time slot window 114 which occurs on line 105 of FIG. 5. Time slot window 114, for accessing bank zero, occurs approximately two 30 nanosecond machine cycles after the bank request signal 113 raised on line 25'. The same bank request signal on line 25' is also employed to generate the aforementioned read bus time slot enable window 115 which is produced on line 88 (also shown in FIG. 5). Thus, it will be understood that the single bank request signal on line 25' reserves the future time slots or windows 114 and 115 without knowing whether the function operation is going to be a read or write operation. It will be understood that the same address in memory cannot be accessed for both the read and write operation. Thus, when one is occurring, the other is busy.

Bank 1 to 4 request signals 116 to 119 are shown for purposes of example for the write operation. If the eight banks raise requests for write operations, they would be executed in ascending numerical order by the pipeline control means 18. However, if any one of the banks shown had not raised a bank request, the bank request for the next occurring bank would be shifted to the left so as to start processing without wasting a request cycle time. Further, having shown that successive or repetitive write operation requests may be executed without time gaps, it is possible that any one of the bank requests may be for a read operation. Thus, if the bank request for bank 2 at 117 happens to be for a read operation rather than a write operation, the time slot enable window produced on line 88 would occur at the time slot shown at window 121.

As a further example, assume that bank requests are raised during the time slots or time cycle shown at times 113, 116, 117 and 118 and that the request for bank zero is a write operation which would be executed during time slot 114. If the bank request at window cycle period 116 happens to be a read request, then the read request will be executed during the time slot 122. As already explained, if the request for bank 2 at 117 was a read request, it would be executed at time slot 121.

When a cache memory is employed, the ratio of write request to read request will approach seven to one and the utilization factor of the access system is well over ninety percent.

Having explained that a bank request is effective for either a read or write operation, the pipeline control reserves the future time slot windows for transfer of information whether it be a read or write operation. It will be understood that each 30 nanosecond time cycle is employed to raise a bank request for either a read or write operation and that the logic shown in FIG. 3 is employed to raise a busy signal for the bank being requested and that the busy signal will prevent another read or write operation to that bank during the operation being performed. The bank busy signals on lines 71 to 74 from FIG. 3 are applied to the pipeline control logic 18 to prevent conflicts for access to a memory bank.

Having explained a preferred embodiment of the present invention using the example of eight processors and their associated eight ports which are employed to raise requests to any one of eight banks of memory in a multiprocessing configuration, it will be understood that the present invention is not applicable to microprocessor technology but is applicable to large mainframe computers which have a large amount of active memory. The feature of the present invention permits the simplification of the access circuitry for multiprocessing systems and yet provides optimum throughput for access to any number of banks of memory associated with a multiprocessing system. Stated differently, the present access system is capable of examining a plurality of requests for access to memory and resolving the priorities between the requests and simultaneously executing requests for access to memory banks which are different and where no conflict occurs, without having to wait for an acknowledgment for the completion of an operation. Thus, it is possible for numerous request operations to be in process simultaneously and only during the unique access time defined by the time slot windows is any particular bank of memory nonaccessible by a different request.

Any request for a bank which is raised at the pipeline control logic 18 remains active as a request until executed. The requests are being executed every 30 nanoseconds so that no dead request time is incurred even though a complete typical read or write operation requires 240 nanoseconds or more.

What is claimed is:

1. An access system for a main storage unit for simultaneously loading read and write pipelined data paths comprising:
   a plurality of memory banks,
   a write bus and a read bus connected to said memory banks,
   a plurality of I/O ports coupled to said write bus and to said read bus,
   pipeline control means having address bus means and control bus means coupled to said memory banks and to said I/O ports,
   processor means coupled to said pipeline control means for raising a plurality of request functions and addresses for the transfer of data on said read bus and said write bus between said memory banks and said I/O ports,
   said pipeline control means being provided with means for sequentially raising either write or read requests on said control bus means for the transfer of pipelined data on said write bus and said read bus and for generating time slot windows during which a subsequent write or read data transfer operation will occur, and
   said pipeline control means further comprising means for accessing different memory bank addresses on said address bus during a write or a read operation so that data on said write and said read buses is being accessed simultaneously.

2. An access system as set forth in claim 1 wherein said plurality of memory banks each comprise address bus input logic coupled to said address bus for receiving said addresses on said address bus.

3. An access system as set forth in claim 1 which further includes control bus input logic means coupled between said pipeline control means and said memory banks.

4. An access system as set forth in claim 2 wherein said address bus input logic further includes an address input buffer register means.

5. An access system as set forth in claim 3 wherein said control bus input logic further includes control input buffer register means.

6. An access system as set forth in claim 4 wherein said address bus input logic further includes a plurality of bank address select registers, one for each memory bank.

7. An access system as set forth in claim 6 which further includes a function decode bank control register coupled to each bank address select register.

8. An access system as set forth in claim 4 wherein said address input buffer registers means comprise an even word and an odd word buffer register for each memory bank.

9. An access system as set forth in claim 3 which further includes control bus output logic coupled between said pipeline control means and said memory banks.

10. An access system as set forth in claim 9 wherein said control bus output logic comprises read bus data registers coupled between said read bus and said memory banks.

11. An access system as set forth in claim 10 wherein said control bus output logic further comprises gating means coupled between said read bus data registers and said memory banks.

12. An access system as set forth in claim 1 wherein said pipeline control means comprises:

write bus logic means for selecting one of said plurality of I/O ports.

13. An access system as set forth in claim 12 wherein said write bus logic means further includes means for raising a busy signal.

14. An access system as set forth in claim 12 wherein said write bus logic means further includes means for raising a write bus time slot window enable signal.

15. An access system as set forth in claim 14 wherein said write bus logic means is coupled to read bus logic means.

16. An access system as set forth in claim 12 wherein said write bus logic means includes means for raising a read bus time slot window enable signal.

17. An access system as set forth in claim 16 which further includes delay means coupled between said write bus logic means and said read bus logic means.

* * * * *